(12) United States Patent
Ladebeck

(10) Patent No.: US 8,928,321 B2
(45) Date of Patent: Jan. 6, 2015

(54) MAGNETIC RESONANCE SYSTEM

(75) Inventor: Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 970 days.

(21) Appl. No.: 12/872,033

(22) Filed: Aug. 31, 2010

(65) Prior Publication Data

US 2011/0074420 A1 Mar. 31, 2011

(30) Foreign Application Priority Data

Sep. 29, 2009 (DE) .......................... 10 2009 043 446

(51) Int. Cl.
*G01R 33/44* (2006.01)
*G01R 33/34* (2006.01)
*G01R 33/3415* (2006.01)
*G01R 33/48* (2006.01)

(52) U.S. Cl.
CPC ...... *G01R 33/34046* (2013.01); *G01R 33/3415* (2013.01); *G01R 33/481* (2013.01)
USPC .......................................... 324/318; 600/410

(58) Field of Classification Search
CPC ..................... G01R 33/34046; G01R 33/3415; G01R 33/481
USPC .......................................... 324/318; 600/410
See application file for complete search history.

(56) References Cited

U.S. PATENT DOCUMENTS

| | | | | |
|---|---|---|---|---|
| 5,548,218 | A * | 8/1996 | Lu .................................. | 324/318 |
| 5,945,827 | A * | 8/1999 | Gronauer et al. ............. | 324/318 |
| 6,980,002 | B1 * | 12/2005 | Petropoulos et al. ......... | 324/318 |
| 7,049,819 | B2 * | 5/2006 | Chan et al. ..................... | 324/319 |
| 7,053,620 | B2 | 5/2006 | Renz | |

(Continued)

FOREIGN PATENT DOCUMENTS

| DE | 10114013 A1 | 10/2002 |
|---|---|---|
| DE | 10324870 A1 | 1/2005 |
| DE | 102006012404 A1 | 9/2007 |
| DE | 102006046287 A1 | 4/2008 |

OTHER PUBLICATIONS

German Office Action dated Apr. 29, 2010 for German Application No. 10 2009 043 446.4-54.

*Primary Examiner* — Melissa Koval
*Assistant Examiner* — Rishi Patel
(74) *Attorney, Agent, or Firm* — Harness, Dickey & Pierce, P.L.C.

(57) ABSTRACT

A magnetic resonance system is disclosed, with a tunnel for accommodating an object under investigation and at least one local coil array. In at least one embodiment, the local coil array is arranged in a fixed position within the tunnel and in the longitudinal direction of the magnetic resonance system, where the geometry of the local coil array, in particular its diameter, can be altered. In at least one embodiment, for the purpose of arranging the local coil array on the patient's body, at least a proportion of the coils of the local coil array is attached to a fixture the volume of which can be altered, either hydraulically or pneumatically. The fixture is subdivided into chambers, the volumes of which can be altered separately in order to realize a bending of the fixture. Or, in at least one embodiment, for the purpose of arranging the local coil array on the patient's body at least a proportion of the coils of the local coil array is arranged on a lamellar structure so that they can be moved relative to each other.

14 Claims, 6 Drawing Sheets

(56) References Cited

U.S. PATENT DOCUMENTS

| | | |
|---|---|---|
| 2002/0138001 A1 | 9/2002 | Kroeckel |
| 2005/0012502 A1* | 1/2005 | Renz ............................ 324/318 |
| 2007/0016003 A1* | 1/2007 | Piron et al. .................... 600/415 |
| 2008/0007259 A1* | 1/2008 | Driemel ........................ 324/260 |
| 2008/0088309 A1 | 4/2008 | Eberler et al. |
| 2008/0129293 A1 | 6/2008 | Schnell et al. |
| 2008/0197849 A1* | 8/2008 | Heid et al. .................... 324/318 |
| 2008/0204021 A1* | 8/2008 | Leussler et al. ............... 324/318 |
| 2009/0027053 A1* | 1/2009 | Decke et al. .................. 324/318 |

* cited by examiner

MAGNETIC RESONANCE SYSTEM

PRIORITY STATEMENT

The present application hereby claims priority under 35 U.S.C. §119 on German patent application number DE 10 2009 043 446.1 filed Sep. 29, 2009, the entire contents of which are hereby incorporated herein by reference.

FIELD

At least one embodiment of the invention generally relates to a magnetic resonance system with a tunnel for accommodating an object under investigation and at least one local coil array, which local coil array is arranged in a fixed position within the tunnel and in the longitudinal direction of the magnetic resonance system, where the geometry of the local coil array, in particular its diameter, can be altered.

BACKGROUND

Magnetic resonance imaging is an imaging technique, well known in every respect, by which position encoding is effected by way of a variable magnetic field gradient. For imaging purposes, a high-frequency impulse is applied to the object under investigation, in order to dislodge the spins from their unexcited positions. After an evolution phase, in which the spin system can be manipulated, and in particular location encoding is undertaken, the signal is then detected. While a large-volume coil, the so-called body coil, is used for the purpose of excitation, for signal detection purposes a local coil array consisting or one or more sub-arrays is placed on the patient. Local coil arrays offer the advantage of greater sensitivity, i.e. their use permits a higher signal-to-noise ratio (SNR) to be achieved.

In the case of whole-body investigations the patient's head is, for example, placed in a head coil. This head coil has a plurality of individual coils, 90 and more coils have already been used in practice. Further coil arrays are arranged on the patient in the region of the thorax, the spinal column and the limbs. All the possible coils and coil arrays on the patient which are used for making measurements are then referred to as the local coil array.

These coils and coil arrays of the local coil array are arranged and attached on the patient outside the magnetic resonance system before the measurements start. For the purpose of carrying out a whole-body measurement, the patient is transported into the tunnel of the magnetic resonance system, but only a proportion of the coils is ever used. In order to reduce costs, there is only a short section within the magnetic resonance system which has an absolutely homogeneous magnetic field, referred to below as the homogeneous region. Measurements are only made in the homogeneous region, which has a length of about 30 cm. In the case of a whole-body investigation however, the coils cover a region of almost 2 m, which is why only a proportion of the coils is used at any one time for the measurements. So that cost savings can be made in the reception chain it is usual to provide only a limited number of receiving units, such as for example special preamplifiers, and to switch each of these to coils which are in the homogeneous region or close to the homogeneous region. The switching electronics which must be provided for this purpose are relatively complex and expensive.

A magnetic resonance system of this generic type is known from DE 10 2006 012 404 A1. There, it is proposed that a local coil element is attached to holders which can be moved and run along the tunnel wall, so that the local coil element can be moved from a storage position lying adjacent to the tunnel into a position on the patient. In another alternative, the local coil element is unrolled beneath the patient like a roller blind. The local coil element can also be stored in its extended state underneath the patient table.

DE 101 14 013 A1 relates to a magnetic resonance system in which a local coil is attached to a drivable carriage, so that it can be moved from a remote position onto the person, where the carriage is attached to a carriage holder which is arranged in a fixed location within the investigation space. In relation to the moving of the local coil onto the person, a fluid drive is disclosed which permits a translational displacement of the local coil from a position away from the person into a position close to the person.

DE 103 24 870 A1 discloses a magnetic resonance system with a local coil arranged in an investigation tunnel. This is arranged on floor-mounted swivel axes running parallel to the tunnel axis, and can be pivoted towards the patient.

DE 10 2006 046 287 A1 describes a field generation unit of a combined MR-PET system, in which use is made of a two-piece HF antenna arrangement, whereby a second part of the HF antenna arrangement, arranged on a horizontal board, can be held temporarily in a fixed position in the system. It is proposed that the second part is exchanged from one patient to another, and that second parts are provided which are pre-adapted for different patients.

SUMMARY

In at least one embodiment of the present application, a magnetic resonance system is disclosed which permits measurements on an object under investigation over a greater length than that which the homogeneous region permits, and which manages without any switching electronics for selecting coils to be linked to the receiver chain.

A magnetic resonance system according to at least one embodiment of the invention wherein, for the purpose of arranging the local coil array on the patient's body, at least a proportion of the coils of the local coil array is attached to a fixture the volume of which can be altered, either hydraulically or pneumatically, where the fixture is subdivided into chambers, the volumes of which can be altered separately in order to realize a bending of the fixture, or that for the purpose of arranging the local coil array on the patient's body at least a proportion of the coils of the local coil array is arranged on a lamellar structure so that they can be moved relative to each other.

Due to the fact that the coils of the local coil array are arranged in fixed positions, a switchover is no longer required. The coils are always located in the homogeneous region of the magnetic resonance system and can thus always be read out. In addition, the user no longer has to fasten on the local coil array before the measurements start, because it is arranged on the tunnel in a fixed location. The result is a time saving, which is also to the patient's benefit.

For the purpose of achieving a symmetrical construction, provision can be made that the local coil array is essentially ring-shaped in cross-section. Here, ring-shaped means not necessarily perfectly circular forms but also elliptical. The patient is in a sense transported through a type of coil tunnel.

However, in terms of the circumference of patients there can sometimes be substantial differences. But the larger the distance between the coils of the local coil array and the object under investigation, i.e. the patient, the lower is the SNR. It is therefore advantageous if the geometry of the local coil array, in particular its diameter, can be changed. In addition, the local coil array can be pivotable. These features allow a manual or automatic adaptation of the geometry of the local coil array to the geometry of the object under investigation, by which means the maximum SNR can be achieved. With no variability in the geometry, the SNR which can be achieved is heavily dependent on the particular patient who is being investigated, because thin, small patients only cover a small part of the cross-sectional area of the local coil array, and thus give a bad space factor. These disadvantages can be avoided by the local coil array being adaptable.

For the purpose of arranging the local coil array on the patient's body, in a first alternative at least a proportion of the coils of the local coil array is attached to a fixture the volume of which can be altered, either hydraulically or pneumatically. Normally, the coils beneath the patient require no adjustment, so that it is sufficient to adjust the arrangement of the coils to the side of and above the patient. One fixture for which the volume can be altered consists of an elastic material which can be filled up to a maximum size while adopting a predefined shape, until a final shape is reached. This final shape is predefined. By filling and emptying the fixture with a gas, in particular air, or a liquid, the shape of the fixture, and with it also the positions of the coils arranged on its surface, can be changed.

The fixture is subdivided into chambers, the volumes of which can be altered separately. With such a subdivision, an almost pin-point change in the shape of the fixture is possible, thereby ensuring the shape of the local coil array is optimally adapted to the patient's shape.

In the second alternative, for the purpose of arranging the local coil array on the patient's body at least a proportion of the coils of the local coil array is arranged on a lamellar structure so that they can be moved relative to each other. Here at least one coil is arranged on a segment of the lamellar structure, and because the segments of the lamellar structure can move relative to each other it is possible to change the surface which can be covered. It is advantageous if the segments of the lamellar structure, each of which has one or more coils of the local coil array, can be moved by means of pulling devices provided on the edge. The coils are accordingly arranged in the central region of the segment, while the fixtures for moving the segments together with the necessary electronics are arranged on the edge. This construction permits optimization of the coil design without the necessity to take into account in detail the later attachment of the segments.

Preferably, the segments of the lamellar structure can consist of a foam-type material. This enables several advantages to be realized. On the one hand, the weight of the segments is minimized by the foam-type structure, so that the appropriate pulling forces to move the segments may also turn out to be lower. In the situation that the segments touch the patient's body, a lower weight will also then press on the patient. On the other hand, a material of this type causes only low radiation attenuation, and is thus suitable for use in combined medical investigation facilities, for example in the combination of a magnetic resonance system with a positron emission tomography facility.

Preferably, it will be possible to arrange at least three coils in the longitudinal direction of the magnetic resonance system on each segment of the lamellar structure, such that they are mutually overlapping. Alternatively, provision can also be made that the individual segments have a different number of coils. The advantage of using the same number of coils on one segment, regardless of whether it is one, two, three or more coils, is in its symmetry. Because, if the construction of the segments is identical, when the coils are moved to adjust to the object under investigation, that is the patient's body, the same effects arise at every segment transition. By this is meant, for example, that the coils from different segments have a mutual coupling. If the construction of the segments is identical the coupling effect is always the same, and can therefore be minimized or prevented by the use of the same components, such as for example capacitors.

Because of their high diagnostic potential, there is a rising demand for combined medical investigation facilities. In order to achieve this combinability, the local coil array can be constructed, in a region which is central relative to the longitudinal axis, to be less radiation attenuating than in the edge areas. This is made possible, for example, by arranging radiation attenuating materials such as capacitors, electronics and holders in the peripheral areas. Because the local coil array has a fixed location, it can then be optimized for the joint operation of a magnetic resonance system with other imaging medical investigation facilities.

Apart from this, at least one embodiment of the invention also relates to a medical investigation facility with a magnetic resonance system of the type described above together with at least one further imaging modality, in particular a positron emission tomography facility or a scintigraphy facility.

BRIEF DESCRIPTION OF THE DRAWINGS

Further advantages, features and details of the invention will be apparent from the example embodiments described below and with reference to the drawings. These show.

DETAILED DESCRIPTION OF THE EXAMPLE EMBODIMENTS

Figure 1:
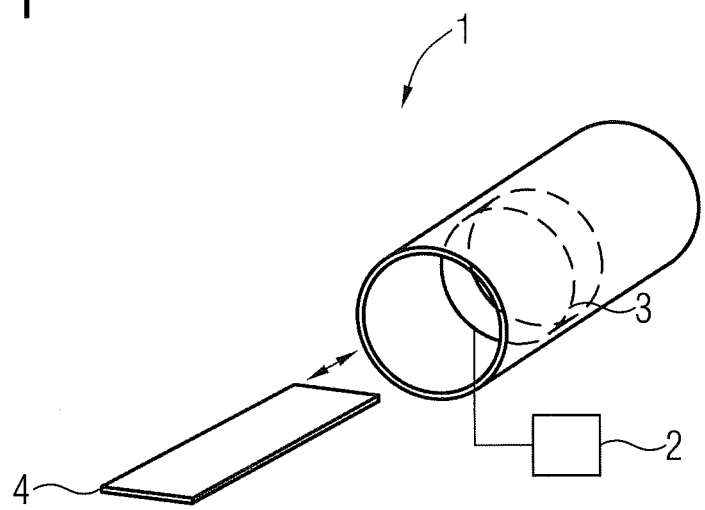
FIG. 1 a magnetic resonance system.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a magnetic resonance system 1 with a controller 2, a local coil array 3 and a patient table 4. For the sake of clarity, further fixtures which are obviously present, such as for example the body coil or even the gradient coils, are not illustrated. The controller 2 actuates each item of electronics of the magnetic resonance system 1, including the electronics of the patient table 4 and of the local coil array 3.

The local coil array 3 has a fixed location, and is in the homogeneous region of the magnetic field of the magnetic resonance system 1. This homogeneous region is essentially in the center of the magnetic resonance system and its length in the longitudinal direction of the magnetic resonance system 1 is approximately 30 cm. Accordingly, the coils of the local coil array 3 must cover a length of about 30 cm. For their excitation, use is made of the body coil, which is present in every magnetic resonance system, which is located in the housing of the magnetic resonance system 1. On the other hand, the local coil array 3 is arranged in the tunnel of the magnetic resonance system 1. Accordingly, the geometry of the local coil array 3 can be adapted for the geometry of the object under investigation, in particular a patient. The adaptation of the geometry of the local coil array 3 to the object under investigation is undertaken in order to maximize the so-called SNR, that is the signal-to-noise ratio. As a rule of thumb, so to speak, one can reliably assume that the SNR is greater, the nearer the coils of the local coil array 3 are located to the object under investigation.

Figure 2:
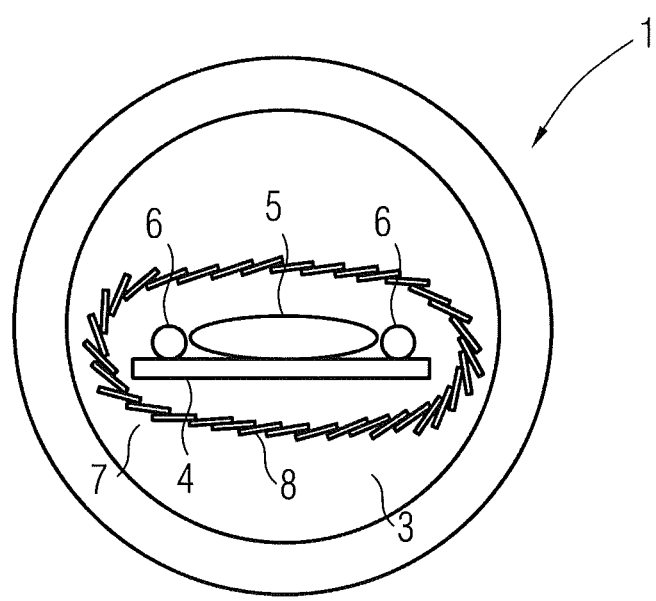
FIG. 2 a magnetic resonance system with a local coil array in a first embodiment, FIG. 3 plan view of the segments of a lamellar structure, FIG. 4 cross-sectional view of the segments of a lamellar structure, FIG. 5 a second form of embodiment of the segments of a lamellar structure, FIG. 6 a magnetic resonance system with a local coil array in a second embodiment, FIG. 7 cross-sectional view of a fixture, the volume of which can be altered in size and shape, FIG. 8 plan view of a fixture, the volume of which can be changed, FIG. 9 plan view of a fixture, the volume of which can be changed, in a second form of embodiment, FIG. 10 plan view of a fixture, the volume of which can be changed, in a third form of embodiment, FIG. 11 plan view of a fixture, the volume of which can be changed, in a fourth form of embodiment, and FIG. 12 a combined medical investigation facility.

FIG. 2 shows a schematic sketch of a local coil array 3, looking into the tunnel of the magnetic resonance system 1. In the cross-section shown, the body 5 and the arms 6 of the patient are illustrated. Around the patient and the patient table 4 is located a lamellar structure 7 with segments 8. The lamellar structure 7 has a circumference which can be altered by moving the segments 8 relative to each other. Such a movement is possible over the entire cross-section of the lamellar structure 7, but it is equally possible to move only the segments 8 to the side of and above the patient, to effect an adjustment for various diameters.

Figure 3:
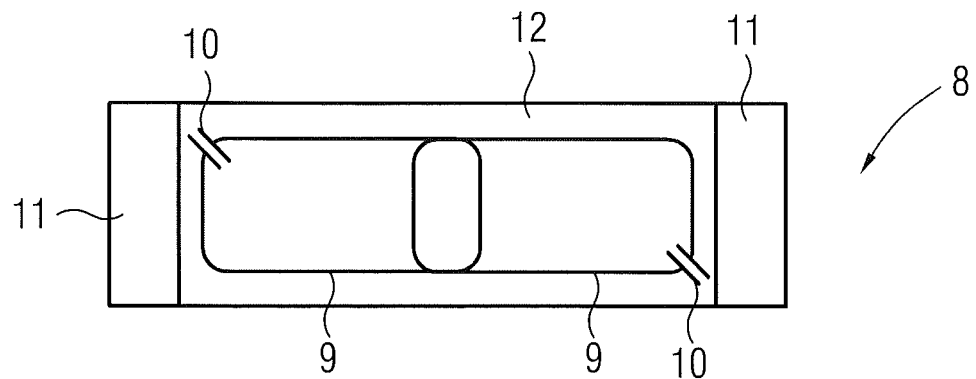

FIG. 3 shows a plan view of a segment 8, where the segment 8 is arranged in the magnetic resonance system 1 in such a way that the longitudinal direction of the segment 8 corresponds to the longitudinal direction of the magnetic resonance system 1. In the central region of the segment there are two coils 9 with capacitors 10, where the capacitors 10, as components which both attenuate radiation and also produce interference in the magnetic field, are arranged on the edge of the segment 8. Also located in the edge regions are further facilities, such as the electronics 11.

The coils 9 are attached to the carrier 12 for the segments 8. The carrier 12 consists of a foam-type material which is compatible with magnetic resonance and has sufficient inherent strength so that pulling movements on the edge of the segment 8 do not lead to the destruction of the segment 8 or its carrier 12, as applicable.

The coils 9 are manufactured from a thin copper layer. Thin in this case means a thickness of about 20 μm. The width of the region covered by the coils is about 30 cm, so that the homogeneous region of the magnetic resonance system is covered. Homogeneous regions with other longitudinal extents therefore require the width of the segments 8 to be also appropriately modified. The width of the copper layer is a few millimeters, for which reason the segments 8 in the central region neither disrupt the homogeneity of the magnetic field to any significant extent nor have any radiation attenuating effect.

Figure 4:
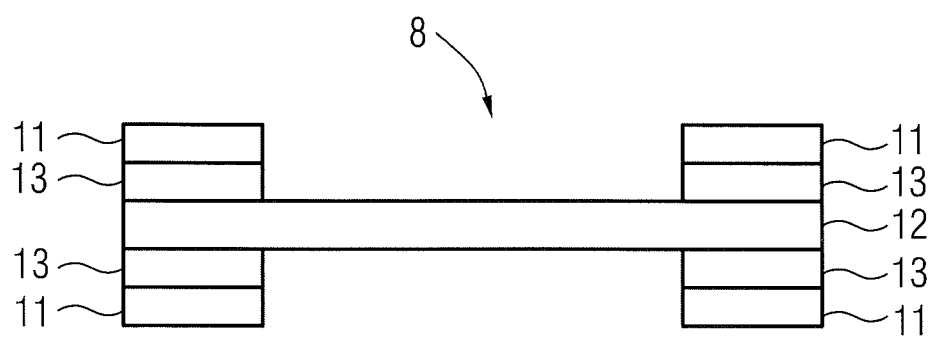

FIG. 4 shows cross-section through a segment 8, where the coils 9 are arranged in the carrier 12. In the edge regions there are, apart from the electronics 11, also further mountings 13, which are required to attach the segment 8 to a pulling device in order to realize moveability of the segment 8.

Figure 5:
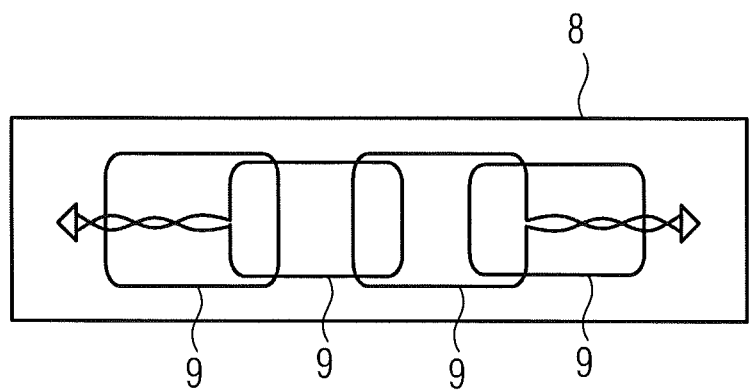

FIG. 5 shows another possibility for arranging the coils 9 on the segment 8. In this case there are four coils 9 on the segment 8, the electronics 11 on the edges not being illustrated here for the sake of clarity. Using this construction, it is possible to increase the sensitivity of the coils 9 of the local coil array 3, but it is then necessary to provide conductors and capacitors 10 in the central region of the segment 8. It is impossible to avoid a radiation attenuating effect from these devices. The number of coils 9 on the segment 8 is basically arbitrary, but each coil requires a conductor, and certain inductances to set the resonant frequency. If there are more than four coils 9, constructional difficulties arise in the realization. In particular, the total number of coils 9 on the lamellar structure 7 should be kept low because otherwise it would then again be necessary to provide selection electronics which connect the coils 9 of the lamellar structure 7 selectively to the components of the receiving electronics.

Figure 6:
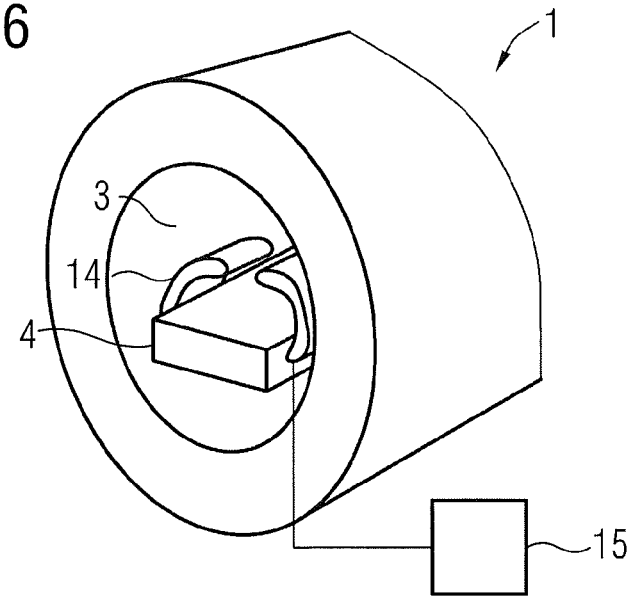

FIG. 6 shows an alternative embodiment of the local coil array 3, which has a fixture 14 the volume of which can be changed. Also shown, schematically, is a pump 15 which is provided for the purpose of filling and emptying the fixture 14, the volume of which can be changed, with a liquid or a gas.

Figure 7:
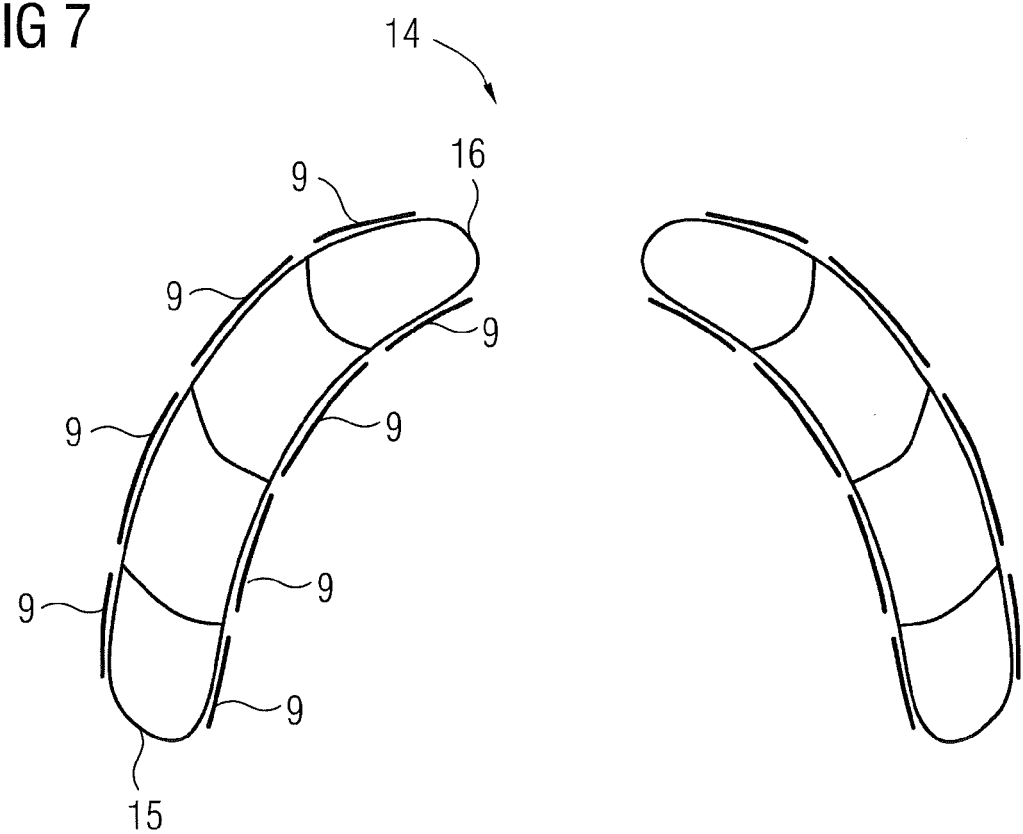

FIG. 7 shows a side view of a fixture 14. The fixture 14 is subdivided into chambers 16, and the coils 9 are arranged on the surface of the fixture 14. In the illustration, the coils 9 are shown on both the side close to the patient and the side away from the patient, in order to describe in principle the arrangement possibilities. In the case of a fixture 14 as used in practice, the coils are obviously either arranged on the one side or on the other side or offset. The coils can be completely attached on the surface of the fixture 14, but the coils 9 can also be only partially attached, for example by the upper half of a surface coil. In this case the coils 9 will have sufficient inherent strength to be able to support themselves.

The individual chambers 16 of the fixture 14, the volume of which can be altered, can here be actuated separately by the pump 15, and can accordingly be filled individually with gas or a liquid, or all at the same time. The chambers 16 themselves are tube-shaped hollow bodies which, in the unstressed state, are unfilled and flexible, and in the filled state adopt a predefined, relatively rigid shape. This makes it possible to effect specific bending of the fixture 14.

As applicable, the chambers 16 or the fixture 14, the volume of which can be altered, are made of an inelastic plastic material, e.g. PUR or PTFE or whatever other plastic is desired. On the side close to the patient, each chamber has a shorter section of wall than on the opposite side. I.e. the walls are asymmetrical. When one, or several or all, of the chambers 16 is/are filled with the filler medium, a gas or a liquid, a pressure builds up inside with the effect that the chamber concerned which is being filled tries to adopt as small a volume as possible with the smallest surface area. Because the walls are inelastic, no expansion can take place. Accordingly, as the filling increases the chambers adopt a predefined shape, by which any desired prescribed bending can be realized.

Figure 8:
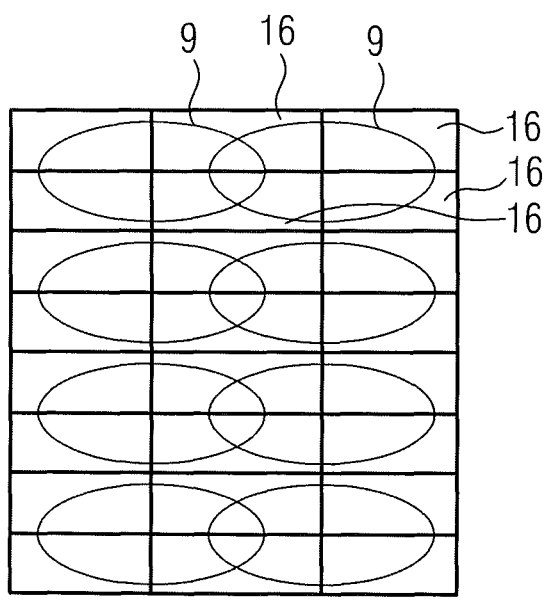
Figure 9:
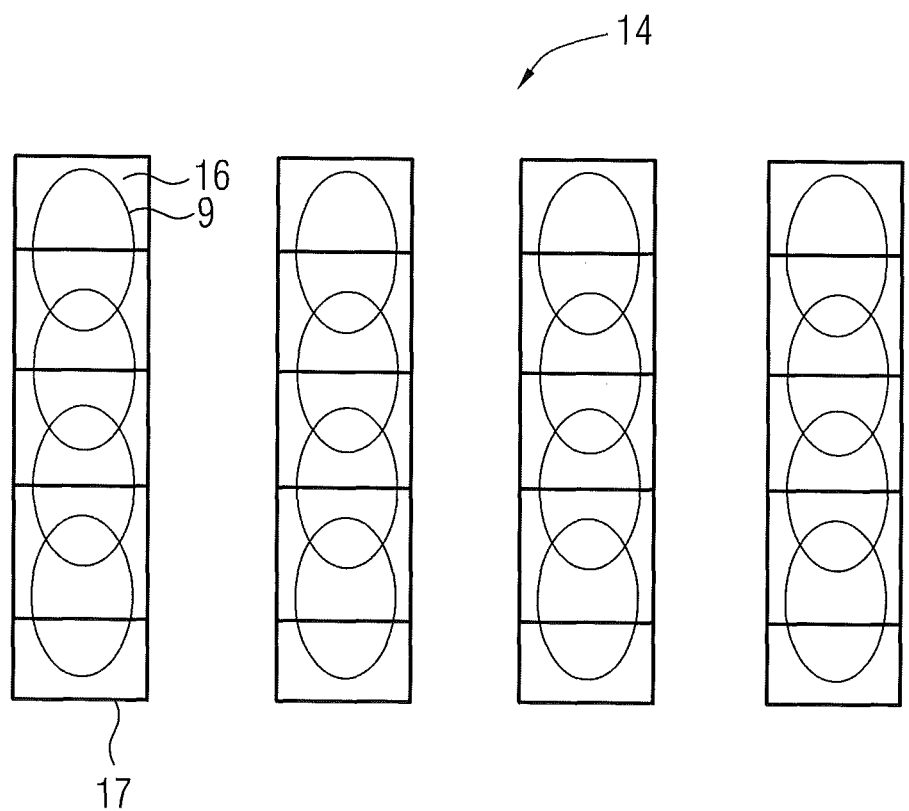

FIG. 8 shows a plan view of one possible embodiment of the fixture 14, where the fixture 14 is subdivided into chambers which are shown as rectangles and to distinguish them more clearly the coils 9 are oval. The coils 9 can of course have any other desired shape. The coils 9 cover several chambers 16, so that by differential filling of the chambers 16 it is possible to realize different alignments of the coils 9 relative to the patient.

Alternatively, the deformable fixture 14 can also have several sub-fixtures 17, which are themselves in turn subdivided into chambers 16. By this means, it is possible to align sections of the fixture 14 which lie close together completely differently relative to the patient, which further improves the adaptability of the fixture 14 to the geometry of the patient. The coils 9, regardless of whether they are arranged on the side of the fixture 14 close to the patient or away from the patient, can overlap, and furthermore they can cover one single chamber 16 or even several chambers 16.

Figure 10:
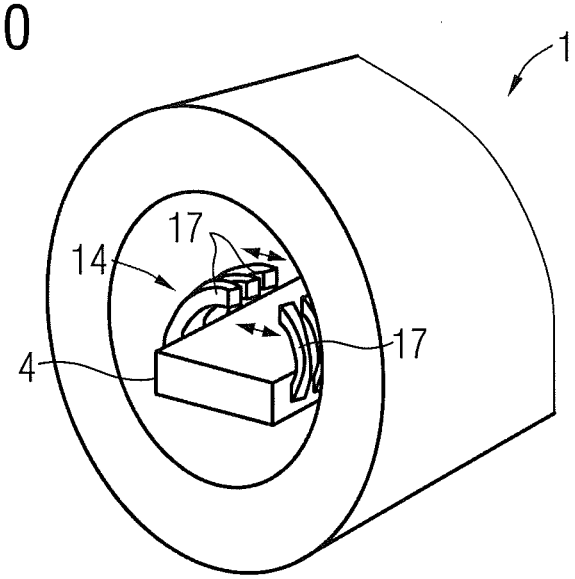

The improved adaptability to the patient is achieved, in particular, on the one hand by the fact that the radii of the different sub-fixtures 17 can be changed by differential filling of the chambers 16, and on the other hand selective filling states of the chamber 16 near the floor also enables the position of the sub-fixtures 17 collectively to be influenced. Slight filling of the chamber 16 or chambers 16 close to the patient, or those close to the tunnel wall, as appropriate, enables the sub-fixture 17 to be pivoted. It then moves away from or towards the patient. On the other hand, by filling or emptying the chambers 16 away from the patient table, the radius of the sub-fixture 17 is changed, by which means it is possible to adapt it for the geometry of the patient. Although it is indeed possible in principle to move the sub-fixture 17 in the longitudinal direction of the magnetic resonance system 1, this is however unnecessary with the construction presented. Because the fixture 14 is matched to the length of the homogeneous region of the magnetic resonance system 1, so that the entire region which is to be measured is detected by the fixture 14. Accordingly, sideways movements, that is movements in the longitudinal direction of the magnetic resonance system 1, are unnecessary. Rather, the movement of the sub-fixtures 17 is effected across the longitudinal direction of the magnetic resonance system 1. This type of adaptation is shown in FIG. 10 by way of clarification. The sub-fixtures 17 can be moved separately towards the patient and away from the patient, and the radius can also be altered as described. For this purpose, the sub-fixtures 17 are constructed as tubes which, starting from the patient table 4, extend more or less vertically upwards. For the purpose of complete detection of the patient, there are further coils 9 under the patient table 4, the positions of which are not altered.

Figure 11:
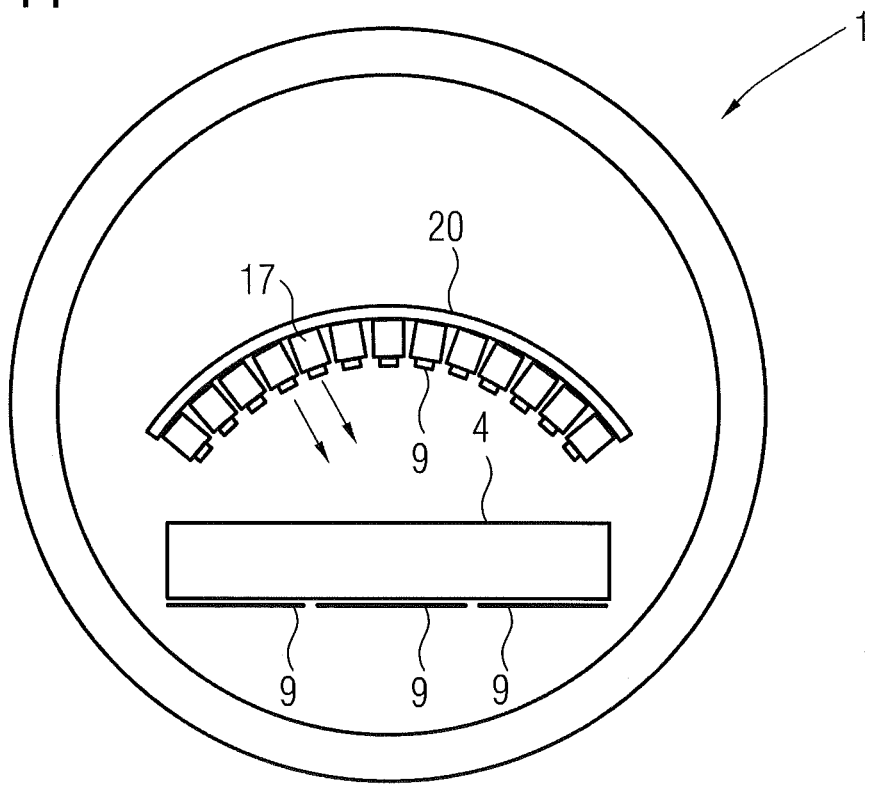

FIG. 11 shows an alternative form of embodiment for the adaptation of the fixture 14 with sub-fixtures 17. The sub-fixtures 17 are in turn constructed as elongated tubes, the longitudinal axes of which run however, in this embodiment, in the direction of the longitudinal axis of the magnetic resonance system 1. The individual sub-fixtures 17 are attached to the mounting 20. The patient is thus advanced through a tunnel-like construction on the patient table 4. The sub-fixtures 17 have a rectangular cross-section, where the sidewalls towards the mounting and towards the patient are less elastic than the sidewalls facing the other sub-fixtures 17. This is equally possible for a single-part embodiment of the sub-fixtures 17 as with a further subdivision with chambers 16. By filling the sub-fixtures 17, the coils 9 which are attached on the side of the sub-fixture 17 towards the patient are brought close to the patient. The fixture 14 can thus be adjusted for any required diameter of patient.

Figure 12:
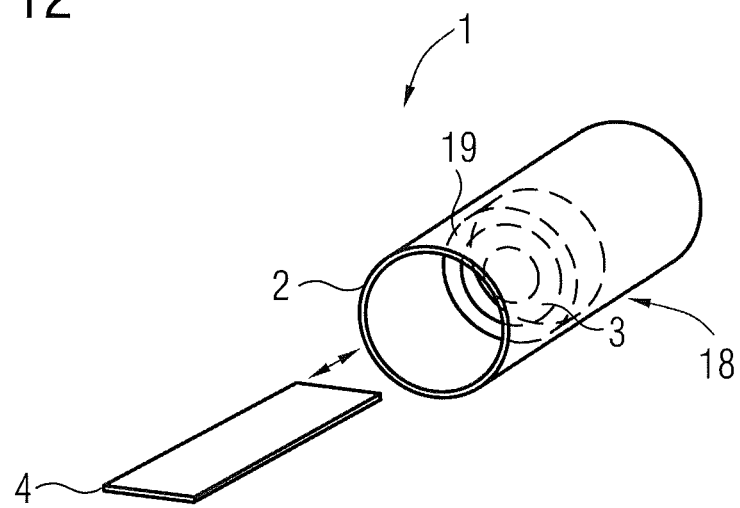

At least one embodiment of the inventive magnetic resonance system with fixed location coil array not only permits simpler switching of the receiver electronics but also improved combinability with other imaging investigation facilities. For radiation-based investigation facilities, in particular, the radiation attenuating fixtures of the high-frequency coils of magnetic resonance systems are problematic. However, on the basis of the embodiments described of the local coil array 3 it is possible to effect optimization of this even for use in a combined investigation facility in that, for example, radiation attenuating elements are kept out of the region of the detection facilities of the other investigation facility. The detector ring of a positron emission tomography facility is an example which can be cited here. Correspondingly, FIG. 12 shows a combined medical investigation facility 17 with a PET detector arrangement 18. The local coil array 3 is arranged within the PET detector arrangement 18 without interfering with the latter during data acquisition. The manufacture of combined medical investigation facilities is accordingly simplified.

In all the forms of embodiment sensors can be provided, for the purpose of detecting the patient's dimensions, these also being arranged in the tunnel of the magnetic resonance system 1. However, instead of additional sensors, it is also possible to provide that a rough overview image is initially recorded at the start of the investigations, using the local coil array 3, with the local coil array 3 having the largest possible diameter or largest possible opening angle, as applicable. Correspondingly, the SNR of the image data recorded will not be optimal, but it will nevertheless still be adequate to detect the dimensions and position of the patient on the patient table 4. The controller 2 is correspondingly designed for evaluating the image data or the sensor data, and actuates the local coil array 3 to correspond to the positioning of the patient. This is possible because the controller 2 also controls the patient table 4.

By the use of the fixed location local coil arrays 3 becomes possible to keep the receiver chain cost-effective, without having to provide selection electronics for actuating the coils 9. The construction of the magnetic resonance facility 1 is thereby simplified, so that it is more cost-effective and less susceptible to interference.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combineable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, computer readable medium and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable medium and is adapted to perform any one of the aforementioned methods when run on a computer device (a device including a processor). Thus, the storage medium or computer readable medium, is adapted to store information and is adapted to interact with a data processing facility or computer device to execute the program of any of the above mentioned embodiments and/or to perform the method of any of the above mentioned embodiments.

The computer readable medium or storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE MARKS

1 Magnetic resonance system
2 Controller
3 Local coil array
4 Patient table
5 Body
6 Arm
7 Lamellar structure
8 Segment
9 Coil
10 Capacitor
11 Electronics 12 Carrier
13 Mounting
14 Deformable fixture
15 Pump
16 Chamber
17 Sub-fixture
18 Combined medical investigation facility
19 PET detector arrangement
20 Mounting

What is claimed is:

1. A magnetic resonance system, comprising:
a tunnel for accommodating an object under investigation; and
at least one local coil array arranged in a fixed location and in the longitudinal direction within the tunnel of the magnetic resonance system, a geometry of the local coil array being alterable, wherein for the purpose of arranging the local coil array on the object under investigation,
at least a portion of the coils of the local coil array is attached to a fixture, a volume of the fixture being alterable hydraulically or pneumatically, the fixture being subdivided into chambers, volumes of the chambers being separately alterable in order to realize a bending of the fixture, and
at least a portion of the coils of the local coil array is arranged on segments of a lamellar structure so as to be movable relative to each other, wherein in a central region relative to the longitudinal axis of the tunnel, the local coil array is configured to attenuate less radiation than in edge regions of the tunnel for the purpose of adding at least one second imaging modality.

2. The magnetic resonance system as claimed in claim 1, wherein a cross section of the local coil array is essentially ring-shaped.

3. The magnetic resonance system as claimed in claim 1, wherein each of the segments of the lamellar structure includes one or more coils of the local coil array, each segment being movable via pulling devices provided on an edge of each segment.

4. The magnetic resonance system as claimed in claim 1, wherein the segments of the lamellar structure consist of a foam-type material.

5. The magnetic resonance system as claimed in claim 1, wherein at least three coils which mutually overlap are arranged in the longitudinal direction of the magnetic resonance system on each segment of the lamellar structure.

6. A medical examination device, comprising:
the magnetic resonance system as claimed in claim 1; and
the at least one second imaging modality.

7. The medical examination device as claimed in claim 6, wherein the at least one second imaging modality is a positron emission tomography facility or a scintigraphy facility.

8. The magnetic resonance system as claimed in claim 1, wherein a diameter of the local coil array is alterable.

9. The magnetic resonance system as claimed in claim 2, wherein each of the segments of the lamellar structure includes one or several coils of the local coil array, each segment being movable via pulling devices provided on an edge of each segment.

10. The magnetic resonance system as claimed in claim 2, wherein the segments of the lamellar structure consist of a foam-type material.

11. The magnetic resonance system as claimed in claim 2, wherein at least three coils which mutually overlap are arranged in the longitudinal direction of the magnetic resonance system on each segment of the lamellar structure.

12. A medical examination device, comprising:
the magnetic resonance system as claimed in claim 2; and
the at least one second imaging modality.

13. The medical examination device as claimed in claim 12, wherein the at least one second imaging modality is a positron emission tomography facility or a scintigraphy facility.

14. A magnetic resonance system, comprising:
a tunnel for accommodating an object under investigation; and
at least one local coil array arranged in a fixed location and in the longitudinal direction within the tunnel of the magnetic resonance system, a geometry of the local coil array being alterable, wherein for the purpose of arranging the local coil array on the object under investigation,
at least a portion of the coils of the local coil array is attached to a fixture, a volume of the fixture being alterable hydraulically or pneumatically, the fixture being subdivided into chambers, volumes of the chambers being separately alterable in order to realize a bending of the fixture, and
at least a portion of the coils of the local coil array is arranged on segments of a lamellar structure so as to be movable relative to each other, wherein in a central region relative to the longitudinal axis of the tunnel, the local coil array is configured to attenuate less radiation along the entire longitudinal axis of the tunnel than in edge regions of the tunnel.

* * * * *